(12) United States Patent
Kim et al.

(10) Patent No.: US 12,255,098 B2
(45) Date of Patent: Mar. 18, 2025

(54) CARRIER SUBSTRATE AND ELEMENT TRANSFER METHOD USING THE SAME

(71) Applicant: CENTER FOR ADVANCED META-MATERIALS, Daejeon (KR)

(72) Inventors: Jae Hyun Kim, Daejeon (KR); Jae Gu Kim, Daejeon (KR); Sang Min Kim, Daejeon (KR); Kwang Seop Kim, Daejeon (KR); Yun Hwangbo, Daejeon (KR); Hak Joo Lee, Daejeon (KR); Se Jeong Won, Daejeon (KR)

(73) Assignee: CENTER FOR ADVANCED META-MATERIALS, Daejeon (KR)

( * ) Notice: Subject to any disclaimer, the term of this patent is extended or adjusted under 35 U.S.C. 154(b) by 504 days.

(21) Appl. No.: 17/741,530

(22) Filed: May 11, 2022

(65) Prior Publication Data
US 2022/0270927 A1 Aug. 25, 2022

Related U.S. Application Data

(63) Continuation of application No. PCT/KR2020/016058, filed on Nov. 16, 2020.

(30) Foreign Application Priority Data

Nov. 15, 2019 (KR) .......................... 10-2019-0146644

(51) Int. Cl.
*H01L 21/78* (2006.01)
*B23K 26/18* (2006.01)
(Continued)

(52) U.S. Cl.
CPC .......... *H01L 21/7813* (2013.01); *B23K 26/18* (2013.01); *B23K 26/20* (2013.01);
(Continued)

(58) Field of Classification Search
None
See application file for complete search history.

(56) References Cited

U.S. PATENT DOCUMENTS

2009/0266479 A1 10/2009 Chung et al.
2014/0238592 A1\* 8/2014 Marinov ............... B32B 37/025
156/272.8
(Continued)

FOREIGN PATENT DOCUMENTS

KR 10-2009-0114033 A 11/2009
KR 10-2018-0028068 A 3/2018
(Continued)

OTHER PUBLICATIONS

International Search Report for PCT/KR2020/016058 mailed Feb. 18, 2021 from Korean Intellectual Property Office.

*Primary Examiner* — Khaja Ahmad
(74) *Attorney, Agent, or Firm* — Revolution IP, PLLC

(57) ABSTRACT

A carrier substrate includes a base layer, an antireflection layer, and an energy absorption layer, wherein the antireflection layer is formed on one surface of the base layer and allows an elastic wave generated by a first laser beam transmitted through an element adhesively bonded to the antireflection layer to be transmitted through the base layer without being reflected towards the element, the first laser beam being applied to the element through a source substrate of the element, and the energy absorption layer is formed between the base layer and the antireflection layer to be aligned with the element, and evaporates upon energy absorption.

20 Claims, 7 Drawing Sheets

(51) Int. Cl.
  *B23K 26/20*   (2014.01)
  *B23K 26/40*   (2014.01)
  *B23K 26/50*   (2014.01)
  *B23K 101/40*  (2006.01)

(52) U.S. Cl.
  CPC .............. *B23K 26/40* (2013.01); *B23K 26/50*
          (2015.10); *B23K 2101/40* (2018.08)

(56) References Cited

U.S. PATENT DOCUMENTS

2017/0162552 A1\*   6/2017   Thompson .......... H01L 33/0093
2017/0215280 A1   7/2017   Chaji
2019/0057891 A1\*   2/2019   Marinov ........... H01L 21/67144
2019/0157533 A1\*   5/2019   Farrens ................ H01L 27/156
2019/0304818 A1   10/2019   Ahn et al.
2020/0235076 A1\*   7/2020   Batres ................ H01L 21/6835

FOREIGN PATENT DOCUMENTS

KR   10-2018-0040770 A   4/2018
KR   10-2019-0114372 A   10/2019

\* cited by examiner

[FIG. 1]
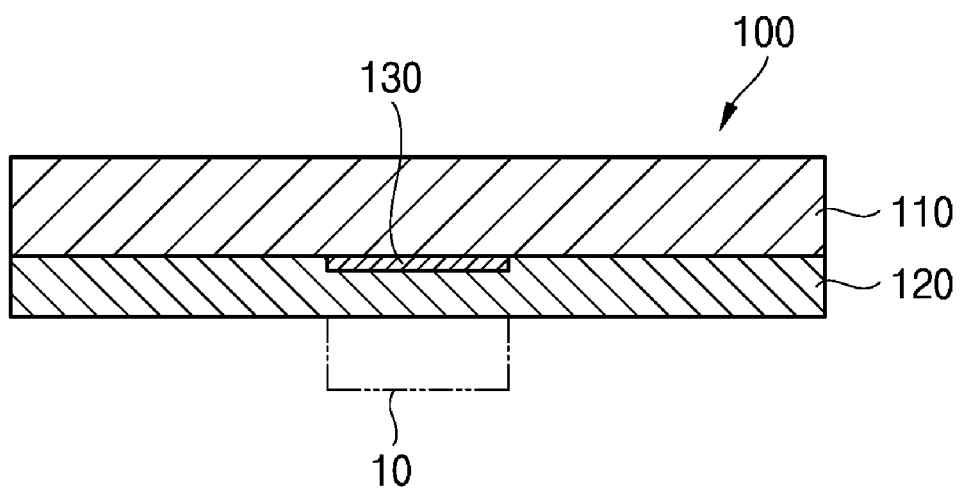

[FIG. 2]
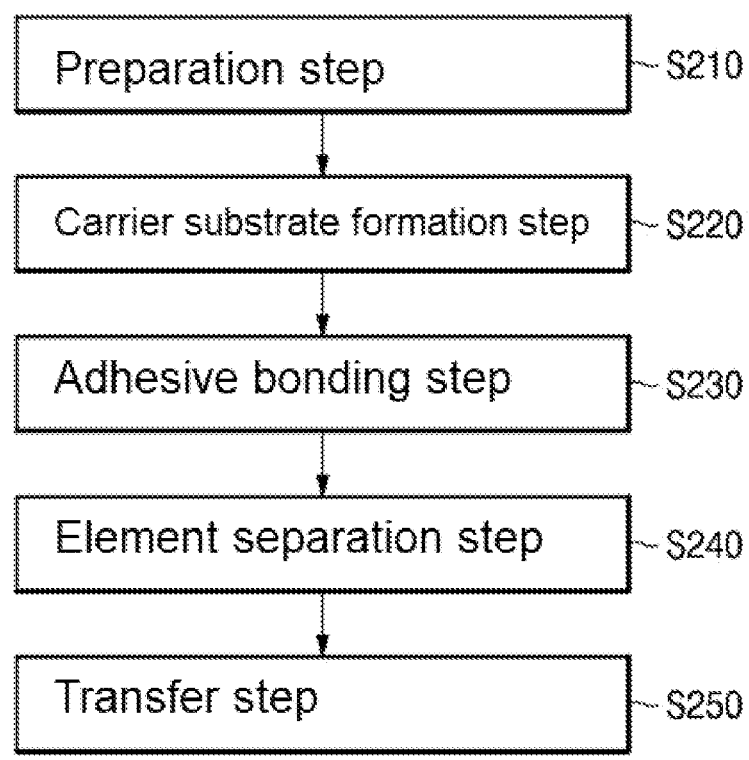

[FIG. 3]
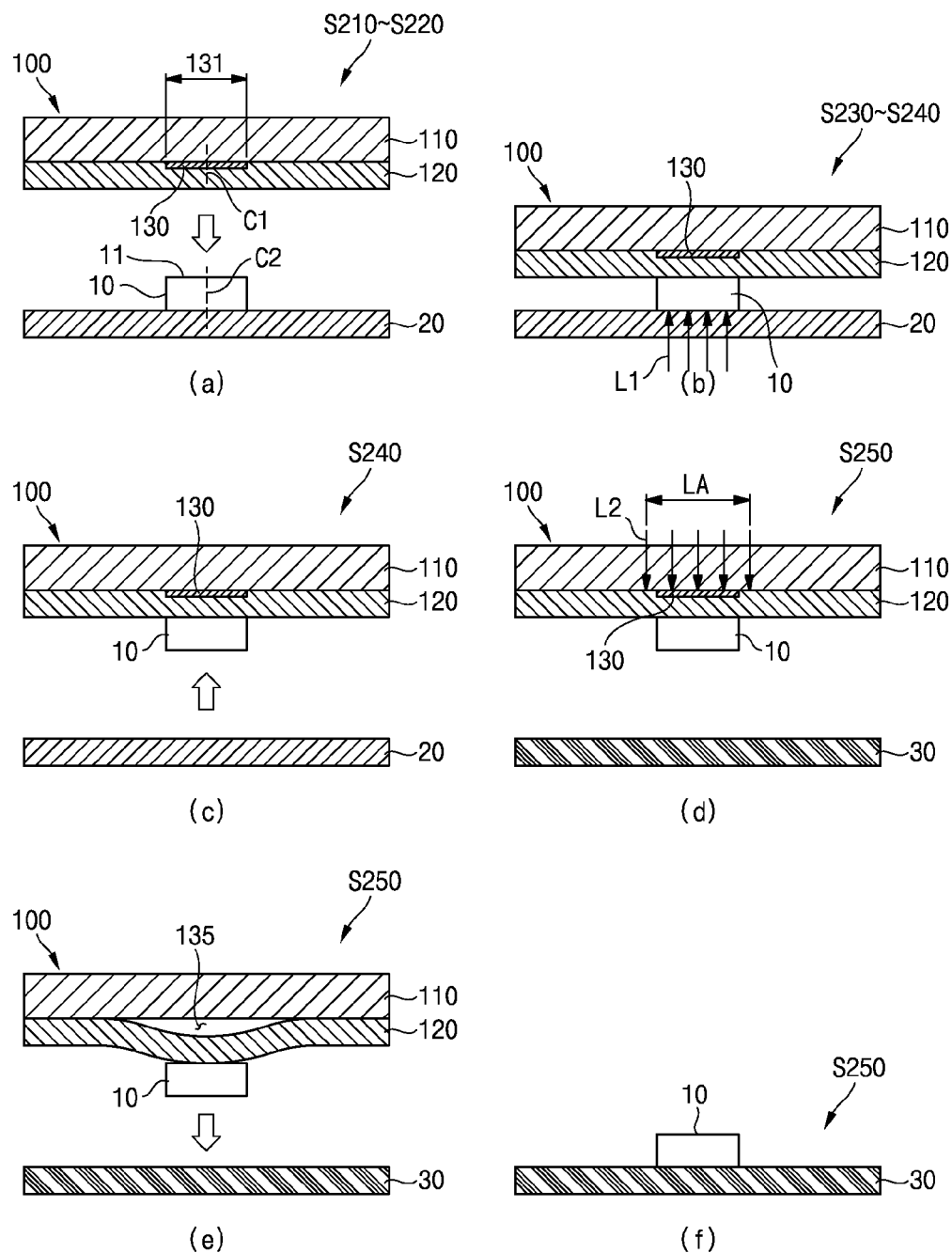

[FIG. 4]
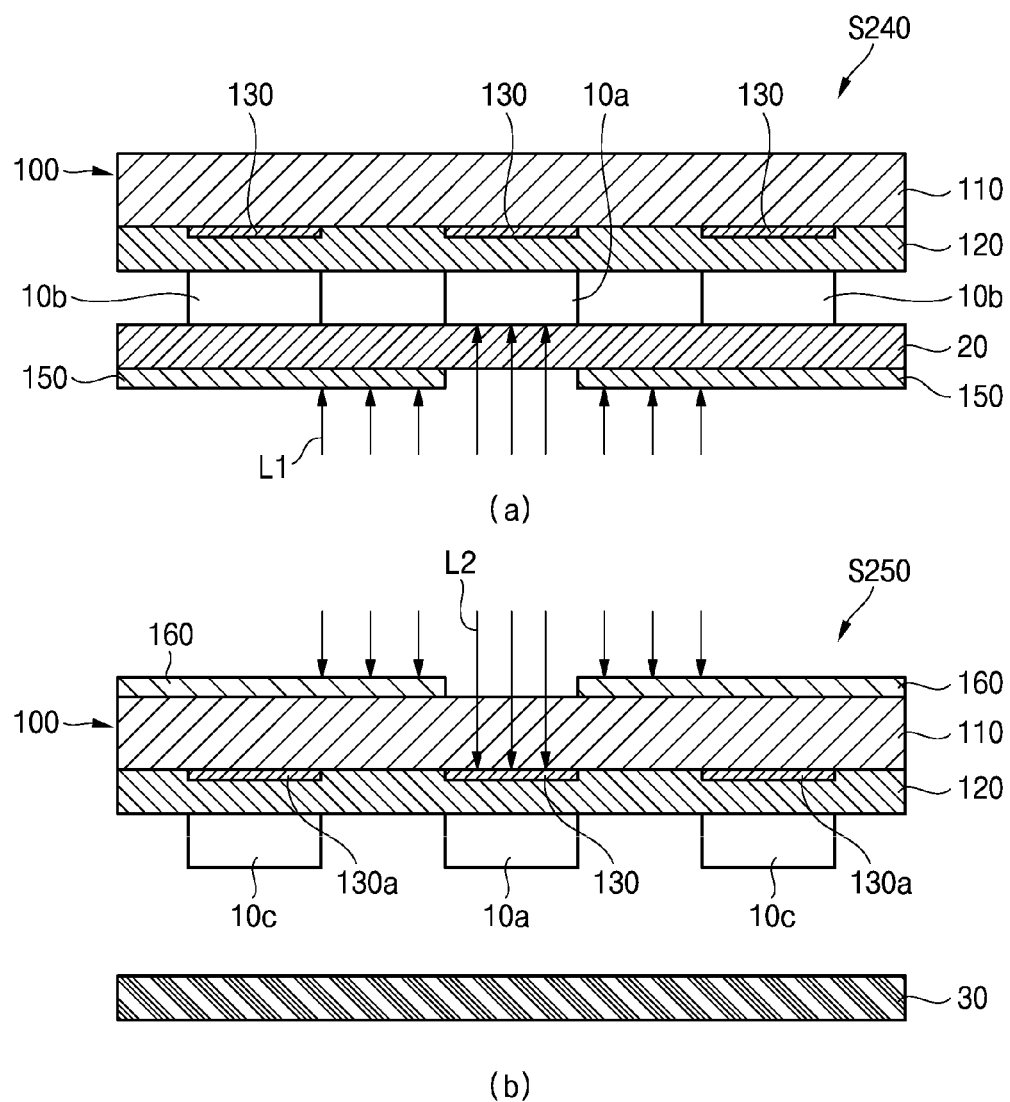
(a)
(b)

[FIG. 5]
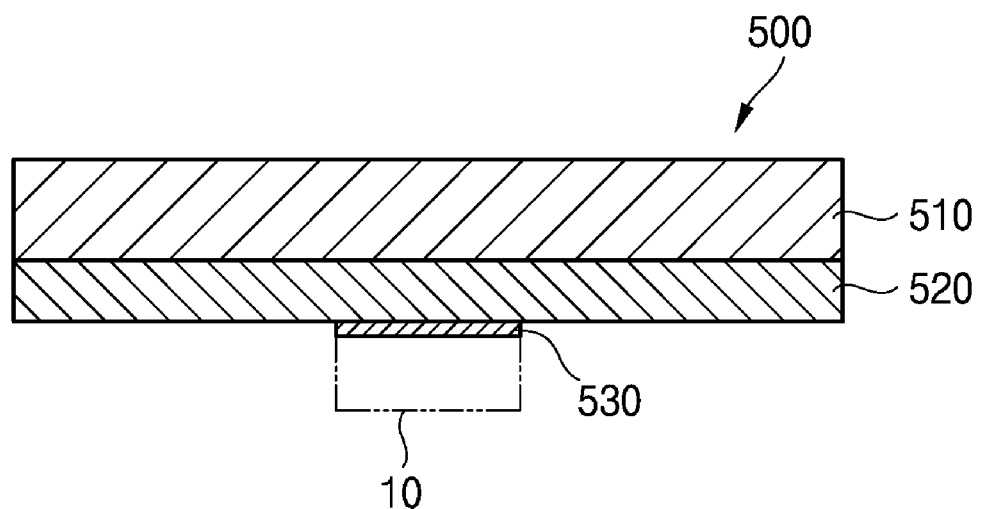

[FIG. 6]
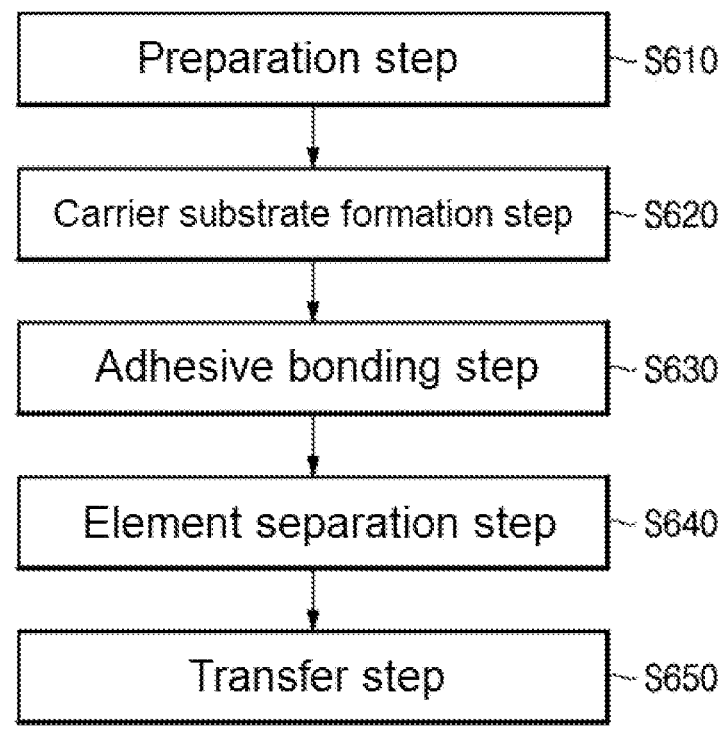

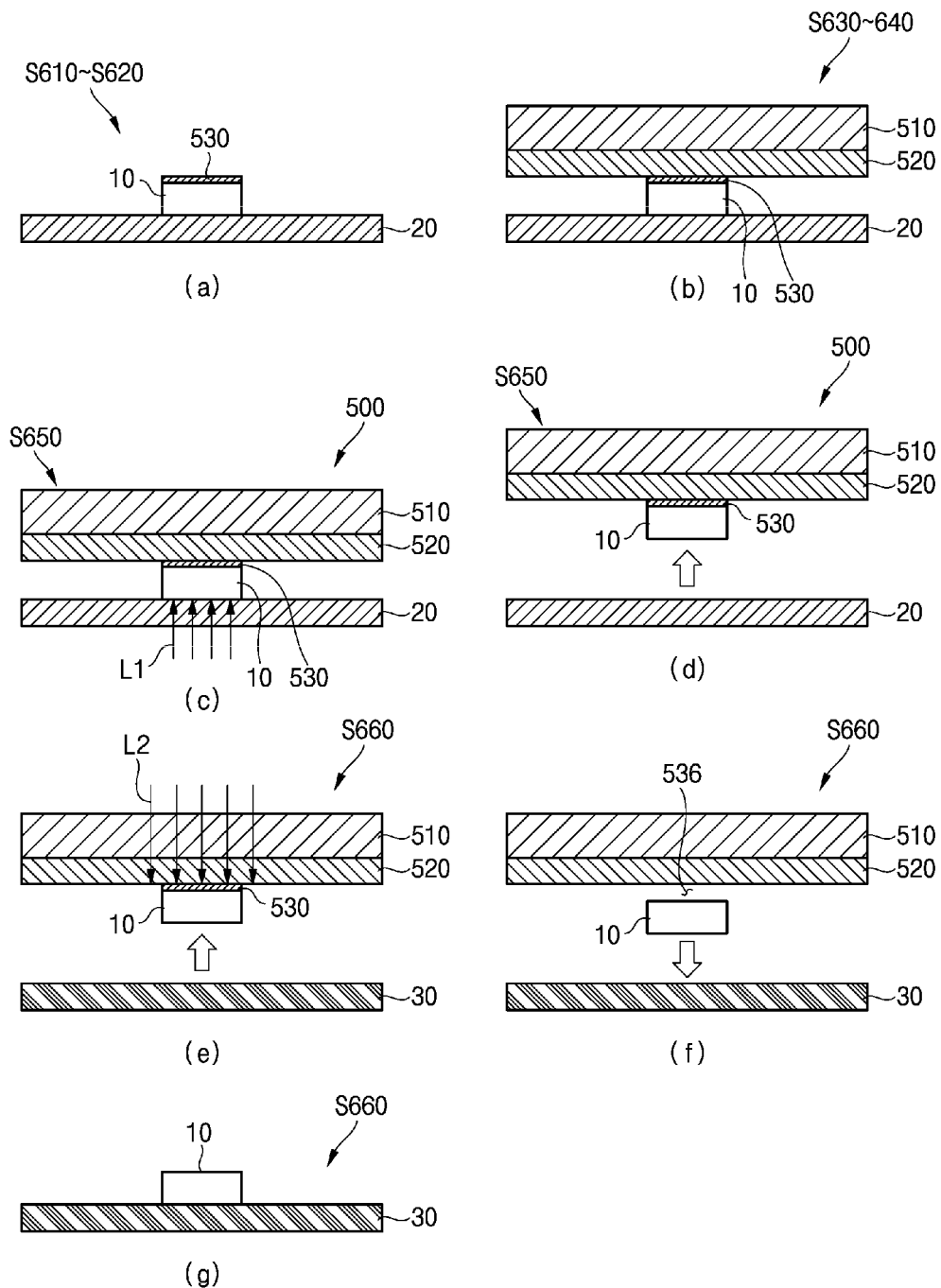
[FIG. 7]

CARRIER SUBSTRATE AND ELEMENT TRANSFER METHOD USING THE SAME

TECHNICAL FIELD

The present invention relates to a carrier substrate and an element transfer method using the same and, more particularly, to a carrier substrate that can prevent damage to an element during transfer of the element while ensuring a high transfer yield and high transfer precision, and an element transfer method using the same.

BACKGROUND ART

GaN-based elements such as LEDs are drawing attention as a high-performance solid-state lighting element due to the ability to obtain high internal quantum efficiency with low power consumption. For growth of such an element, sapphire ($Al_2O_3$) is generally used as a source substrate. The reason for this is that a sapphire substrate is suitable as a substrate for a thin film deposited at high temperatures, such as a gallium nitride (GaN) layer, due to a high melting point thereof and allows growth of a relatively high-quality GaN thin film thereon.

An element transfer method requires a process of separating a GaN thin film from a sapphire substrate with the GaN thin film grown thereon. In order to separate the sapphire substrate, a laser lift-off (LLO) process is commonly used. In the LLO process, a laser beam is allowed to pass through a sapphire substrate to generate local heat at an interface between the sapphire substrate and a GaN-based element, whereby the sapphire substrate can be easily separated.

However, when the element is separated from the source substrate using the LLO process, an elastic wave generated by a laser beam incident on a beam-entry surface of the element is reflected from a free surface and generates tensile stress on the beam-entry surface of the element, causing spallation of the beam-entry surface.

When the element undergoes spallation due to the elastic wave generated by the laser beam, flakes can be broken off of the beam-entry surface of the element.

In addition, bending stress can occur in the element due to a shock wave caused by the laser beam incident on the element. Accordingly, when pressing force is further applied to an edge of the element by a carrier film during a picking process, displacement at the center of the element is increased, causing bending-induced damage to the element.

DISCLOSURE

Technical Problem

Embodiments of the present invention are conceived to solve such problems in the art and it is an object of the present invention to provide a carrier substrate that can prevent damage to an element during transfer of the element while ensuring a high transfer yield and high transfer precision, and an element transfer method using the same.

It will be understood that objects of the present invention are not limited to the above. The above and other objects of the present invention will become apparent to those skilled in the art from the detailed description of the following embodiments in conjunction with the accompanying drawings.

Technical Solution

In accordance with one aspect of the present invention, a carrier substrate includes: a base layer; an antireflection layer formed on one surface of the base layer and allowing an elastic wave generated by a first laser beam transmitted through an element adhesively bonded to the antireflection layer to be transmitted through the base layer without being reflected towards the element, the first laser beam being applied to the element through a source substrate of the element; and an energy absorption layer formed between the base layer and the antireflection layer to be aligned with the element, the energy absorption layer evaporating upon energy absorption.

In accordance with another aspect of the present invention, a carrier substrate includes: a base layer; an antireflection layer formed on one surface of the base layer and allowing an elastic wave generated by a first laser beam transmitted through an element adhesively bonded to the antireflection layer to be transmitted through the base layer without being reflected towards the element, the first laser beam being applied to the element through a source substrate of the element; and an energy absorption layer formed between the antireflection layer and the element, the energy absorption layer evaporating upon energy absorption.

In one embodiment, the energy absorption layer may be evaporated by a second laser beam applied through the base layer.

In one embodiment, the energy absorption layer to which the second laser beam is applied may have a smaller area than a cross-sectional area of the second laser beam.

In one embodiment, a center of the energy absorption layer may coincide with a center of the element.

In one embodiment, the energy absorption layer may be formed in a shape corresponding to a surface of the element facing the energy absorption layer.

In accordance with a further aspect of the present invention, an element transfer method using a carrier substrate includes: a preparation step in which a source substrate having an element on one surface thereof is prepared; a carrier substrate formation step in which the carrier substrate is formed, the carrier substrate comprising a base layer, an antireflection layer formed on one surface of the base layer and allowing an elastic wave generated by a first laser beam applied to the element through the source substrate and transmitted through the element to be transmitted through the base layer without being reflected towards the element, and an energy absorption layer formed between the base layer and the antireflection layer and evaporating upon energy absorption; an adhesive bonding step in which the element is adhesively bonded to the antireflection layer with the antireflection layer facing the element and the energy absorption layer aligned with the element; an element separation step in which the element is separated from the source substrate by applying the first laser beam to the element; and a transfer step in which the element is transferred to a target substrate by placing the element above the target substrate and applying a second laser beam to the energy absorption layer to remove adhesion between the element and the antireflection layer through evaporation of the energy absorption layer.

In accordance with yet another aspect of the present invention, an element transfer method using a carrier substrate includes: a preparation step in which a source substrate having an element thereon is prepared, wherein the element has an energy absorption layer formed on one surface thereof, the energy absorption layer evaporating upon energy absorption; a carrier substrate formation step in which the carrier substrate is formed, the carrier substrate comprising a base layer and an antireflection layer formed on one surface of the base layer and allowing an elastic wave generated by a first laser beam applied to the element through the source substrate and transmitted through the element to be transmitted through the base layer without being reflected towards the element; an adhesive bonding step in which the element is adhesively bonded to the antireflection layer such that the energy absorption layer is placed between the antireflection layer and the element; an element separation step in which the element is separated from the source substrate by applying the first laser beam to the element; and a transfer step in which the element is transferred to a target substrate by placing the element above the target substrate and applying a second laser beam to the energy absorption layer to remove adhesion between the element and the antireflection layer through evaporation of the energy absorption layer.

In one embodiment, in the transfer step, the second laser beam may have a larger cross-sectional area than an area of the energy absorption layer.

In one embodiment, in the transfer step, the second laser beam may be applied to the energy absorption layer through the base layer.

In one embodiment, in the element separation step, a first mask may be further disposed on the other surface of the source substrate such that the first laser beam is applied to a specific element among multiple elements on the source substrate through the first mask to separate only the specific element from the source substrate.

In one embodiment, in the transfer step, a second mask may be further disposed on the other surface of the base layer such that the second laser beam is applied to a specific energy absorption layer among multiple energy absorption layers on the carrier substrate through the second mask to transfer only an element aligned with the specific energy absorption layer to the target substrate.

Advantageous Effects

With the antireflection layer formed on one surface of the base layer, the carrier substrate according to the present invention can allow an elastic wave generated by the first laser beam incident on the element through the source substrate to be transmitted through the base layer without undergoing reflection, thereby preventing spallation of the element.

In addition, according to the embodiments, since the energy absorption layer is aligned with the element, an expanded space formed by evaporation of the energy absorption layer is most convex at a location corresponding to the center of the element. Accordingly, adhesion between the antireflection layer and the element is decreased from an edge of the element toward the center of the element, eventually causing the element to lose adhesion to the antireflection layer at the center of the element. As a result, the element can fall vertically downwards and can be accurately transferred to a desired location on the target substrate.

It will be understood that advantageous effects of the present invention are not limited to the above and include any advantageous effects conceivable from the features disclosed in the detailed description of the present invention or the appended claims.

DESCRIPTION OF DRAWINGS

FIG. 1 is a sectional view of a carrier substrate according to a first embodiment of the present invention.

FIG. 2 is a flowchart of an element transfer method using the carrier substrate of FIG. 1.

FIG. 3 is an exemplary view illustrating steps of the element transfer method using the carrier substrate shown in FIG. 2.

FIG. 4 is an exemplary view illustrating an example of using a mask in the element transfer method using the carrier substrate shown in FIG. 3.

FIG. 5 is a sectional view of a carrier substrate according to a second embodiment of the present invention.

FIG. 6 is a flowchart of an element transfer method using the carrier substrate of FIG. 5.

FIG. 7 is an exemplary view illustrating steps of the element transfer method using the carrier substrate shown in FIG. 6.

MODE FOR INVENTION

Reference will now be made in detail to various embodiments in conjunction with the accompanying drawings. It should be understood that the present invention may be embodied in different ways and is not limited to the following embodiments. In the drawings, portions irrelevant to the description will be omitted for clarity. Like components will be denoted by like reference numerals throughout the specification.

Throughout the specification, when an element or layer is referred to as being "on," "connected to," or "coupled to" another element or layer, it may be directly on, connected to, or coupled to the other element or layer, or intervening elements or layers may be present. In addition, unless stated otherwise, the term "includes" should be interpreted as not excluding the presence of other components than those listed herein.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, embodiments of the present invention will be described with reference to the accompanying drawings.

FIG. 1 is a sectional view of a carrier substrate according to a first embodiment of the present invention, FIG. 2 is a flowchart of an element transfer method using the carrier substrate of FIG. 1, and FIG. 3 is an exemplary view illustrating steps of the element transfer method of FIG. 2.

Now, a carrier substrate 100 and an element transfer method using the carrier substrate will be described with reference to FIG. 1 to FIG. 3.

Referring to FIG. 1 to FIG. 3, the element transfer method using the carrier substrate may include a preparation step S210, a carrier substrate formation step S220, an adhesive bonding step S230, an element separation step S240, and a transfer step S250.

In the preparation step S210, a source substrate 20 having an element 10 formed on one surface thereof is prepared.

The source substrate 20 is a substrate for formation of the element 10, and may be a sapphire substrate.

The element 10 may be an object to be transferred from the source substrate 20 to a target substrate 30. The element 10 may be a gallium nitride-based (GaN-based) light emitting diode (LED), without being limited thereto.

In the carrier substrate formation step S220, a carrier substrate 100 is formed. The carrier substrate 100 may include a base layer 110, an antireflection layer 120, and an energy absorption layer 130.

The base layer 110 may be formed of a transparent material, preferably a material that can transmit a second laser beam L2 described below.

The antireflection layer 120 may be formed on one surface of the base layer 110. The antireflection layer 120 allows an elastic wave generated due to peeling-off at an interface between the source substrate 20 and the element 10 caused by a first laser beam L1 transmitted through the element 10 to be transmitted through the base layer without being reflected towards the element 10.

To this end, the antireflection layer 120 may have an impedance in a specific range relative to an impedance of the element 10 formed on the source substrate 20. Here, "impedance" refers to acoustic impedance and is defined as the product of density of a medium and velocity of sound through the medium. The velocity of sound through the medium is proportional to the square root of the elastic modulus of the medium. Thus, acoustic impedance may be used interchangeably with elastic impedance.

The elastic wave is generated by a laser beam incident on a beam-entry surface of the element 10, and can generate tensile stress on the beam-entry surface of the element 10 upon reflection from a free surface.

The antireflection layer 120 may be formed of a material having a similar elastic modulus or density to a material forming the element 10. For example, the antireflection layer 120 may be formed of a material having an elastic modulus corresponding to that of the element 10. Since gallium nitride (GaN), which is a material forming the element 10, has an elastic modulus of hundreds of GPa, a polymer having an elastic modulus on the order of GPa, such as an acrylic polymer or epoxy, is more suitable as the antireflection layer 120 than a material having a low elastic modulus on the order of MPa, such as rubber or polydimethylsiloxane (PDMS).

In addition, gallium nitride (GaN), which is a material forming the element 10, has an acoustic impedance of 42.43 MRayl, whereas air has an acoustic impedance of 0.0004 MRayl. Due to this large difference in acoustic impedance between gallium nitride and air, the elastic wave generated by the first laser beam L1 transmitted through the element 10 can be reflected from an interface between the element 10 and air.

Epoxy has an acoustic impedance of 3.00 MRayl, polyvinylidene fluoride (PVDF) has an acoustic impedance of 4.20 MRayl, and polymethylmethacrylate (PMMA), which is an acrylic polymer, has an acoustic impedance of 3.32 MRayl. That is, these materials have higher acoustic impedance than air. Accordingly, when the antireflection layer 120 is formed of these materials, the elastic wave generated by the first laser beam L1 transmitted through the element 10 can be transmitted through the base layer without undergoing reflection.

In summary, it is desirable that the antireflection layer 120 have an elastic modulus on the order of GPa, like gallium nitride (GaN), which is a material forming the element 10, and an acoustic impedance $\frac{1}{15}$ to 1 times that of gallium nitride (GaN), which is a material forming the element 10. Thus, the antireflection layer 120 may be formed of epoxy or PMMA, which meet these requirements.

The energy absorption layer 130 may be formed between the base layer 110 and the antireflection layer 120. The energy absorption layer 130 may be aligned with the element 10 to be adhesively bonded to the carrier substrate. The energy absorption layer 130 may evaporate upon energy absorption. The energy absorption layer 130 may be formed of a polymer that can absorb a second laser beam L2 described below. Alternatively, the energy absorption layer 130 may be a metal layer of gold (Au) or platinum (Pt) having a thickness of several to tens of nanometers, or may be formed of a metal oxide that can absorb the second laser beam L2 described below, such as zinc oxide (ZnO) (bandgap energy: 3.37 eV (corresponding to a wavelength of 375 nm)). Here, the second laser beam L2 preferably has a wavelength shorter than a wavelength corresponding to the band gap energy of the metal oxide.

In the adhesive bonding step S230, the element 10 is adhesively bonded to the antireflection layer 120 with the antireflection layer 120 facing the element 10 and the energy absorption layer 130 aligned with the element 10.

In the adhesive bonding step S230, the antireflection layer 120 may be adhesively bonded to the element 10 such that a first center C1 of the energy absorption layer 130 coincides with a second center C2 of the element 10, whereby the energy absorption layer 130 can be aligned with the element 10.

In addition, the energy absorption layer 130 may be formed in a shape corresponding to a surface 11 of the element 10 facing the energy absorption layer 130.

When the first center C1 of the energy absorption layer 130 coincides with the second center C2 of the element 10, the energy absorption layer 130 can be placed to coincide with an area of a projection of the element 10 in a vertically upward direction of the element 10.

In the element separation step S240, the element 10 is separated from the source substrate 20 by applying a first laser beam L1 to the element 10.

Upon performing a laser lift-off (LLO) process to separate the element 10 from the source substrate 20, the first laser beam L1 may be applied to the element 10 through the source substrate 20.

Here, the first laser beam L1 may be focused at a junction between the source substrate 20 and the element 10. The first laser beam incident on the element 10 may be defocused and moved towards an interface between the element 10 and the antireflection layer 120 while passing through the element 10.

Without the antireflection layer 120, an elastic wave generated by the first laser beam would be reflected from the interface between the element 10 and the base layer 110 due to a large impedance difference between the element 10 and the base layer 110. The reflected elastic wave can generate tensile stress on a surface of the element 10 adjoining the source substrate 20, causing spallation of the element 10.

According to the present invention, due to the presence of the antireflection layer 120, an elastic wave generated by the first laser beam L1 moved to the interface between the element 10 and the antireflection layer 120 through the element 10 can be transmitted through the antireflection layer 120 without undergoing reflection. Thus, according to the present invention, it is possible to prevent spallation of the element 10.

The first laser beam L1 transmitted through the element 10 is in a defocused state and thus does not have enough energy to evaporate the energy absorption layer 130. That is, the energy absorption layer 130 is not affected by the first laser beam L1.

The first laser beam L1 may be a laser beam emitted from an excimer laser or a diode-pumped solid-state (DPSS) laser.

In the transfer step S250, the element is transferred to the target substrate 30 by placing the element 10 above a target point on the target substrate 30 and applying a second laser beam L2 to the energy absorption layer 130 to remove adhesion between the element 10 and the antireflection layer 120 through evaporation of the energy absorption layer 130.

In the transfer step S250, the second laser beam L2 may be applied to the energy absorption layer 130 through the base layer 110.

The second laser beam L2 may be a UV laser beam. Here, the base layer 110 may be formed of transparent quartz or sapphire to transmit the second laser beam L2 therethrough.

When the second laser beam L2 is applied to the energy absorption layer 130, the energy absorption layer 130 absorbs energy and evaporates. As the energy absorption layer 130 evaporates and expands in volume, a space having been occupied by the energy absorption layer 130 is expanded. Then, the antireflection layer 120 is pushed out by the expanded space 135 and a bonding area between the element 10 and the antireflection layer 120 is decreased, eventually causing the element 10 to fall and be transferred to the target substrate 30.

Even when the center of the second laser beam L2 does not exactly coincide with the center of the energy absorption layer 130, uniform evaporation over the entire region of the energy absorption layer 130 can be achieved.

As described above, the energy absorption layer 130 is aligned with the element 10. Accordingly, when the second laser beam L2 is applied to a portion of the energy absorption layer 130 and the energy absorption layer evaporates, a limited space having been occupied by the energy absorption layer 130 is filled with and expanded by a vaporized gas of the energy absorption layer 130. Here, the expanded space 135 is most convex at a location corresponding to the center of the element 10.

Accordingly, adhesion between the antireflection layer 120 and the element 10 is decreased from an edge of the element 10 toward the center of the element 10, eventually causing the element 10 to lose adhesion to the antireflection layer 120 at the center of the element 10. As a result, the element 10 can fall vertically downwards and can be accurately transferred to a desired location on the target substrate 30.

In addition, a cross-sectional area LA of the second laser beam L2 may be larger than the area 131 of the energy absorption layer 130. In this way, even when the center of the second laser beam L2 does not coincide with the center of the energy absorption layer 130, energy can be uniformly supplied to the entire energy absorption layer 130 and the expanded space 135 can be generated in the same form at the same location.

According to the present invention, separation of the element 10 from the source substrate 20 and transfer of the separated element 10 to the target substrate 30 can be performed using a single carrier substrate 100. Accordingly, a manufacturing process can be simplified by eliminating the need for an additional process such as preparation of a separate substrate for element rearrangement after the LLO process.

FIG. 4 is an exemplary view illustrating an example of using a mask in the element transfer method using the carrier substrate shown in FIG. 3.

Referring to FIG. 4(a), in the element separation step S240, a first mask 150 may be further disposed on the other surface of the source substrate 20 such that the first laser beam L1 is applied to a specific element 10a among multiple elements 10a, 10b on the source substrate 20 through the first mask 150 to separate only the specific element 10a from the source substrate 20.

That is, when the first mask 150 is disposed on the other surface of the source substrate 20 to expose only a specific element 10a among multiple elements 10a, 10b, only the specific element 10a can be irradiated with the first laser beam L1 through an opening of the first mask 150 even when the first laser beam L1 is applied over the entire region of the first mask 150.

In this way, it is possible to ensure that only a target element 10a is separated from the source substrate and transferred to the carrier substrate 100 while preventing other elements 10b apart from the target element 10a from being separated from the source substrate and transferred to the carrier substrate 100.

Referring to FIG. 4(b), in the transfer step S250, a second mask 160 may be further disposed on the other surface of the base layer 110 such that the second laser beam L2 is applied to a specific energy absorption layer 130 among multiple energy absorption layers 130, 130a on the carrier substrate 100 through the second mask 160 to transfer only an element 10a aligned with the specific energy absorption layer 130 to the target substrate.

That is, when the second mask 160 is disposed on the other surface of the base layer 110 to expose only a specific energy absorption layer 130 among multiple energy absorption layers 130, 130a, only the specific energy absorption layer 130 can be irradiated with the second laser beam L2 through an opening of the second mask 160 even when the second laser beam L2 is applied over the entire region of the second mask 160.

In this way, it is possible to ensure that only a target element 10a falls and is transferred to the target substrate 30 while preventing other elements 10b apart from the target element 10a from falling and being transferred to the target substrate 30.

FIG. 5 is a sectional view of a carrier substrate according to a second embodiment of the present invention, FIG. 6 is a flowchart of an element transfer method using the carrier substrate of FIG. 5, and FIG. 7 is an exemplary view illustrating steps of the element transfer method using the carrier substrate shown in FIG. 6.

Since the carrier substrate according to the second embodiment is the same as the carrier substrate according to the first embodiment except for the position of the energy absorption layer and a relevant process step, repeated description thereof will be omitted.

Referring to FIG. 5 to FIG. 7, the element transfer method using the carrier substrate according to this embodiment may include a preparation step S610, a carrier substrate formation step S620, an adhesive bonding step S630, an element separation step S640, and a transfer step S650.

In the preparation step S610, a source substrate 20 having an element 10 disposed thereon is prepared, wherein the element 10 includes an energy absorption layer 530 formed on one surface thereof, the energy absorption layer 530 evaporating upon energy absorption.

The energy absorption layer 530 may be formed on the surface of the element 10 through a separate process after formation of the element 10 on the source substrate 20.

In the carrier substrate preparation step S620, a carrier substrate 500 is formed, wherein the carrier substrate 500 includes a base layer 510 and an antireflection layer 520 formed on one surface of the base layer 510 and allowing an elastic wave generated by a first laser beam L1 transmitted through the element 10 to be transmitted through the base layer without being reflected towards the element 10. Here, the base layer 510 and the antireflection layer 520 may be the same as the base layer 110 and the antireflection layer 120 described in the first embodiment, respectively.

In the adhesive bonding step S630, the element 10 is adhesively bonded to the antireflection layer 520 such that the energy absorption layer 530 is placed between the antireflection layer 520 and the element 10.

In the second embodiment, the energy absorption layer 530 is placed between the antireflection layer 520 and the element 10 since the element 10 with the energy absorption layer 530 formed on one surface thereof is adhesively bonded to the antireflection layer 520. Accordingly, the energy absorption layer 530 can be aligned with the element 10 without performing the process of aligning the energy absorption layer 530 with the element 10 as described in the first embodiment.

In the element separation step S640, the element 10 is separated from the source substrate 20 by applying the first laser beam L1 to the element 10.

The energy absorption layer 530 may have the same acoustic impedance as the antireflection layer 520. Accordingly, the first laser beam L1 can be transmitted through the energy absorption layer 530 and the antireflection layer 520.

In the transfer step S650, the element 10 is transferred to a target substrate 30 by placing the element 10 above the target substrate 30 and applying a second laser beam L2 to the energy absorption layer 530 to remove adhesion between the element 10 and the antireflection layer 520 through evaporation of the energy absorption layer 530.

In the second embodiment, as the energy absorption layer 530 evaporates, a space having been occupied by the energy absorption layer 530 becomes a void space 536, causing the element 10 to lose adhesion to the antireflection layer 520. As a result, the element 10 falls and is transferred to the target substrate 30.

In one embodiment, a metal terminal formed on one surface of the element 10 may be used as the energy absorption layer 530. In this embodiment, a separate process for forming the energy absorption layer 530 on the element 10 may be omitted.

It will be understood that the second embodiment may also employ selective element separation using the first mask and selective element transfer to the target substrate using the second mask, like the first embodiment.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention. For example, components described as implemented separately may also be implemented in combined form, and vice versa.

The scope of the present invention is indicated by the following claims and all changes or modifications derived from the meaning and scope of the claims and equivalents thereto should be construed as being within the scope of the present invention.

INDUSTRIAL APPLICABILITY

The present invention may be industrially applied to the field of element transfer technology to prevent damage to an element during transfer of the element and to ensure a high transfer yield and high transfer precision.

The invention claimed is:

1. A carrier substrate comprising:
   a base layer;
   an antireflection layer formed on one surface of the base layer and allowing an elastic wave generated by a first laser beam transmitted through an element adhesively bonded to the antireflection layer to be transmitted through the base layer without being reflected towards the element, the first laser beam being applied to the element through a source substrate of the element; and
   an energy absorption layer formed between the base layer and the antireflection layer to be aligned with the element, the energy absorption layer evaporating upon energy absorption.

2. The carrier substrate according to claim 1, wherein the energy absorption layer is evaporated by a second laser beam applied through the base layer.

3. The carrier substrate according to claim 2, wherein the energy absorption layer to which the second laser beam is applied has a smaller area than a cross-sectional area of the second laser beam.

4. The carrier substrate according to claim 1, wherein a center of the energy absorption layer coincides with a center of the element.

5. The carrier substrate according to claim 1, wherein the energy absorption layer is formed in a shape corresponding to a surface of the element facing the energy absorption layer.

6. A carrier substrate comprising:
   a base layer;
   an antireflection layer formed on one surface of the base layer and allowing an elastic wave generated by a first laser beam transmitted through an element adhesively bonded to the antireflection layer to be transmitted through the base layer without being reflected towards the element, the first laser beam being applied to the element through a source substrate of the element; and
   an energy absorption layer formed between the antireflection layer and the element, the energy absorption layer evaporating upon energy absorption.

7. The carrier substrate according to claim 6, wherein the energy absorption layer is evaporated by a second laser beam applied through the base layer.

8. The carrier substrate according to claim 7, wherein the energy absorption layer to which the second laser beam is applied has a smaller area than a cross-sectional area of the second laser beam.

9. The carrier substrate according to claim 6, wherein a center of the energy absorption layer coincides with a center of the element.

10. The carrier substrate according to claim 6, wherein the energy absorption layer is formed in a shape corresponding to a surface of the element facing the energy absorption layer.

11. An element transfer method using a carrier substrate, comprising:
    a preparation step in which a source substrate having an element on one surface thereof is prepared;
    a carrier substrate formation step in which the carrier substrate is formed, the carrier substrate comprising a base layer, an antireflection layer formed on one surface of the base layer and allowing an elastic wave generated by a first laser beam applied to the element through the source substrate and transmitted through the element to be transmitted through the base layer without being reflected towards the element, and an energy absorption layer formed between the base layer and the antireflection layer and evaporating upon energy absorption;

an adhesive bonding step in which the element is adhesively bonded to the antireflection layer with the antireflection layer facing the element and the energy absorption layer aligned with the element;

an element separation step in which the element is separated from the source substrate by applying the first laser beam to the element; and a transfer step in which the element is transferred to a target substrate by placing the element above the target substrate and applying a second laser beam to the energy absorption layer to remove adhesion between the element and the antireflection layer through evaporation of the energy absorption layer.

12. The element transfer method according to claim 11, wherein, in the transfer step, the second laser beam has a larger cross-sectional area than an area of the energy absorption layer.

13. The element transfer method according to claim 11, wherein, in the transfer step, the second laser beam is applied to the energy absorption layer through the base layer.

14. The element transfer method according to claim 11, wherein, in the element separation step, a first mask is further disposed on the other surface of the source substrate such that the first laser beam is applied to a specific element among multiple elements on the source substrate through the first mask to separate only the specific element from the source substrate.

15. The element transfer method according to claim 11, wherein, in the transfer step, a second mask is further disposed on the other surface of the base layer such that the second laser beam is applied to a specific energy absorption layer among multiple energy absorption layers on the carrier substrate through the second mask to transfer only an element aligned with the specific energy absorption layer to the target substrate.

16. An element transfer method using a carrier substrate, comprising:

a preparation step in which a source substrate having an element thereon is prepared, the element having an energy absorption layer formed on one surface thereof, the energy absorption layer evaporating upon energy absorption;

a carrier substrate formation step in which the carrier substrate is formed, the carrier substrate comprising a base layer and an antireflection layer formed on one surface of the base layer and allowing an elastic wave generated by a first laser beam applied to the element through the source substrate and transmitted through the element to be transmitted through the base layer without being reflected towards the element;

an adhesive bonding step in which the element is adhesively bonded to the antireflection layer such that the energy absorption layer is placed between the antireflection layer and the element;

an element separation step in which the element is separated from the source substrate by applying the first laser beam to the element; and a transfer step in which the element is transferred to a target substrate by placing the element above the target substrate and applying a second laser beam to the energy absorption layer to remove adhesion between the element and the antireflection layer through evaporation of the energy absorption layer.

17. The element transfer method according to claim 16, wherein, in the transfer step, the second laser beam has a larger cross-sectional area than an area of the energy absorption layer.

18. The element transfer method according to claim 16, wherein, in the transfer step, the second laser beam is applied to the energy absorption layer through the base layer.

19. The element transfer method according to claim 16, wherein, in the element separation step, a first mask is further disposed on the other surface of the source substrate such that the first laser beam is applied to a specific element among multiple elements on the source substrate through the first mask to separate only the specific element from the source substrate.

20. The element transfer method according to claim 16, wherein, in the transfer step, a second mask is further disposed on the other surface of the base layer such that the second laser beam is applied to a specific energy absorption layer among multiple energy absorption layers on the carrier substrate through the second mask to transfer only an element aligned with the specific energy absorption layer to the target substrate.

* * * * *